US012811608B2

(12) United States Patent
Al-Baidhani et al.

(10) Patent No.: US 12,811,608 B2
(45) Date of Patent: Nov. 24, 2026

(54) LOW-DENSITY PARITY-CHECK (LDPC) ENCODING AND SIGNALING IN A WIRELESS NETWORK

(71) Applicant: NXP USA, Inc., Austin, TX (US)

(72) Inventors: Amer Al-Baidhani, Santa Clara, CA (US); Yan Zhang, Palo Alto, CA (US); Rui Cao, Sunnyvale, CA (US); Sudhir Srinivasa, Los Gatos, CA (US); Hongyuan Zhang, Fremont, CA (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 18/629,795

(22) Filed: Apr. 8, 2024

(65) Prior Publication Data

US 2024/0340026 A1 Oct. 10, 2024

Related U.S. Application Data

(60) Provisional application No. 63/561,480, filed on Mar. 5, 2024, provisional application No. 63/494,999, filed on Apr. 7, 2023.

(51) Int. Cl.

| | |
|---|---|
| ***H03M 13/25*** | (2006.01) |
| ***H04L 1/00*** | (2006.01) |
| ***H04L 5/00*** | (2006.01) |
| ***H04W 84/12*** | (2009.01) |

(52) U.S. Cl.

CPC ........ *H03M 13/255* (2013.01); *H04L 1/0008* (2013.01); *H04L 5/0007* (2013.01); *H04W 84/12* (2013.01)

(58) Field of Classification Search

CPC ........... H03M 13/255; H03M 13/1102; H03M 13/6362; H04L 1/0008; H04L 5/0007; H04L 1/0618; H04L 1/0041; H04L 1/0057; H04L 1/0067; H04W 84/12

See application file for complete search history.

(56) References Cited

U.S. PATENT DOCUMENTS

2015/0293812 A1* 10/2015 Roberts .................. G11C 29/04 714/764
2016/0028416 A1* 1/2016 Luby ................. H03M 13/3761 714/779
2020/0389259 A1* 12/2020 Zhang ................... H04L 1/1893
2021/0135803 A1* 5/2021 Chang ............... H04W 74/0808
2022/0069899 A1* 3/2022 Rueger ..................... G08G 5/26
2022/0224362 A1* 7/2022 Chen .................. H03M 13/1102
2023/0133677 A1* 5/2023 Sun ....................... H04L 1/0067 370/328

OTHER PUBLICATIONS

IEEE, "IEEE Std 802.11-2020", Section 19.3.11.6-19.3.11.8.3, IEEE Standard for Information Technology-Local and mertropolitan Area Networks-Specific Requirements, Pat 11: Wireless LAN MAC and PHY Specifications, 2021, pp. 2902-2907.

(Continued)

*Primary Examiner* — Thien Nguyen

(57) ABSTRACT

Embodiments of a method and apparatus for wireless communications are disclosed. In an embodiment, a wireless device includes a controller configured to generate a control signal and a wireless transceiver configured to, in response the control signal, perform a low-density parity-check (LDPC) encoding operation to generate an encoded data unit with extra LDPC symbol segments.

20 Claims, 9 Drawing Sheets

(56) References Cited

OTHER PUBLICATIONS

IEEE, "IEEE Std 802.11-2020", Section 21.3.10.5-21.3.10.6, IEEE Standard for Information Technology-Local and mertropolitan Area Networks-Specific Requirements, Pat 11: Wireless LAN MAC and PHY Specifications, 2021, pp. 3071-3073.

IEEE, "IEEE P802.11-REVme™/D1.3", Draft Standard for Information Technology-Telecommunications and Information Exchange between Systems Local and Metropolitan Area Networks-Specific Requirements/D1.3, Jun. 2022.

IEEE, "IEEE Std 802.11ax-2021", IEEE Standard for Information Technology—Telecommunications and Information Exchange between Systems Local and Metropolitan Area Networks—Specific Requirements Part 11: Wireless LAN Medium Access Control (MAC) and Physical Layer (PHY) Specifications Amendment 1: Enhancements for High-Efficiency WLAN, 2021, 767 pgs.

Chen, Xiaogang et al.; "Revisiting of the LDPC rate matching"; doc.: IEEE 802.11-23/0667r0; Apr. 24, 2023; 17 pages.

* cited by examiner

TABLE 19-16 – PPDU ENCODING PARAMETERS

| RANGE OF $N_{avbits}$ (BITS) | NUMBER OF LDPC CODEWORDS ($N_{CW}$) | LDPC CODEWORD LENGTH $L_{LDPC}$ (BITS) |
|---|---|---|
| $N_{avbits} \leq 648$ | 1 | 1296, IF $N_{avbits} \geq N_{pld} + 912 \times (1\text{-}R)$<br>648, OTHERWISE |
| $648 < N_{avbits} \leq 1296$ | 1 | 1944, IF $N_{avbits} \geq N_{pld} + 1464 \times (1\text{-}R)$<br>1296, OTHERWISE |
| $1296 < N_{avbits} \leq 1944$ | 1 | 1944 |
| $1944 < N_{avbits} \leq 2592$ | 2 | 1944, IF $N_{avbits} \geq N_{pld} + 2916 \times (1\text{-}R)$<br>1296, OTHERWISE |
| $2592 < N_{avbits}$ | $\left[ \frac{N_{pld}}{1944 \cdot R} \right]$ | 1944 |

FIG. 5

| BIT | SUBFIELD | NUMBER OF BITS | DESCRIPTION |
|---|---|---|---|
| B0-B3 | SPATIAL REUSE | 4 | INDICATES WHETHER OR NOT SPATIAL REUSE MODES ARE ALLOWED DURING THE TRANSMISSION OF THIS PPDU.<br>SET TO A VALUE FROM TABLE 27-22 (SPATIAL REUSE FIELD ENCODING FOR AN HE SU PPDU, HE ER PPDU, AND HE MU PPDU). NOTE THAT TABLE 27-22 (SPATIAL REUSE FIELD ENCODING FOR AN HE SU PPDU, HE ER PPDU), AND HE MU PPDU) ALSO APPLIES TO EHT MU PPDU. SEE 35.11.2 (SPATIAL_REUSE) AND 35.10 (EHT SPATIAL REUSE OPERATION) |
| B4-B5 | GI+LTF SIZE | 2 | INDICATES THE GI DURATION AND EHT-LTF SIZE:<br>SET TO 0 TO INDICATE 2xLTF + 0.8 μs GI.<br>SET TO 1 TO INDICATE 2xLTF + 1.6 μs GI.<br>SET TO 2 TO INDICATE 4xLTF + 0.8 μs GI.<br>SET TO 3 TO INDICATE 4xLTF + 3.2 μs GI. |
| B6-B8 | NUMBER OF EHT-LTF SYMBOLS | 3 | INDICATE THE NUMBER EHT-LTF SYMBOLS:<br>SET TO 0 TO INDICATE 1 EHT-LTF SYMBOL.<br>SET TO 1 TO INDICATE 2 EHT-LTF SYMBOLS.<br>SET TO 2 TO INDICATE 4 EHT-LTF SYMBOLS.<br>SET TO 3 TO INDICATE 6 EHT-LTF SYMBOLS.<br>SET TO 4 TO INDICATE 8 EHT-LTF SYMBOLS.<br>VALUES 5-7 ARE VALIDATE. |
| B9 | LDPC EXTRA SYMBOL SEGMENT | 1 | INDICATES THE PRESENCE OF THE LDPC EXTRA SYMBOL SEGMENT:<br>SET TO 1 IF AN LDPC EXTRA SYMBOL SEGMENT IS PRESENT.<br>SET TO 0 IF AN LDPC EXTRA SYMBOL SEGMENT IS NOT PRESENT. |
| B10-B11 | PRE-FEC PADDING FACTOR | 2 | INDICATES THE PRE-FEC PADDING FACTOR:<br>SET TO 0 TO INDICATE A PRE-FEC PADDING FACTOR OF 4.<br>SET TO 1 TO INDICATE A PRE-FEC PADDING FACTOR OF 1. |

FIG. 7

LOW-DENSITY PARITY-CHECK (LDPC) ENCODING AND SIGNALING IN A WIRELESS NETWORK

CROSS-REFERENCE TO RELATED APPLICATIONS

This application is entitled to the benefit of U.S. Provisional Patent Application Ser. No. 63/494,999, filed on Apr. 7, 2023, and U.S. Provisional Patent Application Ser. No. 63/561,480, filed on Mar. 5, 2024, the contents of each of which are incorporated by reference herein.

BACKGROUND

Wireless communications devices, e.g., access points (APs) or non-AP devices can transmit various types of information using different transmission techniques. For example, various applications, such as, Internet of Things (IoT) applications can conduct wireless local area network (WLAN) communications, for example, based on Institute of Electrical and Electronics Engineers (IEEE) 802.11 family of standards (e.g., Wi-Fi standards). Some applications, for example, video teleconferencing, streaming entertainment, high definition (HD) video surveillance applications, outdoor video sharing applications, etc., require relatively high system throughput. Forward error correction (FEC) techniques, such as low-density parity-check (LDPC) encoding techniques, can be used to improve an effective coding rate in a wireless network (e.g., a WLAN), allowing for more data to be transmitted.

SUMMARY

Embodiments of a method and apparatus for wireless communications are disclosed. In an embodiment, a wireless device includes a controller configured to generate a control signal and a wireless transceiver configured to, in response the control signal, perform a low-density parity-check (LDPC) encoding operation to generate an encoded data unit with extra LDPC symbol segments. Other embodiments are also disclosed.

In an embodiment, the encoded data includes a physical layer protocol data unit (PPDU).

In an embodiment, the encoded data includes a payload that contains orthogonal frequency division multiplexing (OFDM) symbols, and the number of the OFDM symbols contained in the payload is equal to or smaller than a predefined threshold.

In an embodiment, the wireless transceiver is further configured to, in response the control signal, determine a number of extra LDPC symbol segments to be included in the encoded data unit based on different criteria.

In an embodiment, the wireless transceiver is further configured to, in response the control signal, determine one extra LDPC symbol segment to be included in the encoded data unit based on a first criterion, two extra LDPC symbol segments to be included in the encoded data unit based on a second criterion and to determine three extra LDPC symbol segments to be included in the encoded data unit based on a third criterion.

In an embodiment, the wireless transceiver is further configured to, in response the control signal, define an extra symbol segment field to indicate the extra LDPC symbol segments within the encoded data unit.

In an embodiment, the wireless transceiver is further configured to, in response the control signal, define a 2-bit extra symbol segment field to indicate up to three extra LDPC symbol segments included in the encoded data unit.

In an embodiment, the wireless transceiver is further configured to, in response the control signal, determine an adaptive number of extra LDPC symbol segments to be included in the encoded data unit to fill to an end of an OFDM symbol.

In an embodiment, the adaptive number of extra LDPC symbol segments is greater than a threshold, and an extra orthogonal frequency division multiplexing (OFDM) symbol is added if an initial number of the extra LDPC symbol segments is less than the threshold.

In an embodiment, the wireless transceiver is further configured to, in response the control signal, add an additional extra LDPC symbol segment in the encoded data unit when a number of OFDM symbols contained in a payload of the encoded data unit is equal to or smaller than a predefined threshold.

In an embodiment, the wireless transceiver is further configured to, in response the control signal, add an additional extra LDPC symbol segment in the encoded data unit based on a punctured parity bit ratio that is lower than a standard punctured parity bit ratio when a number of OFDM symbols contained in a payload of the encoded data unit is equal to or smaller than a predefined threshold.

In an embodiment, a smallest encoding boundary of a last OFDM data symbol and a size of an LDPC symbol segment is less than a standard value of ¼ of one OFDM symbol.

In an embodiment, the wireless device includes a wireless access point (AP), and the wireless transceiver is further configured to transmit the encoded data unit to a second device, which includes a non-AP wireless station (STA) device.

In an embodiment, the wireless device is compatible with an Institute of Electrical and Electronics Engineers (IEEE) 802.11 protocol.

In an embodiment, the wireless device is a component of a multi-link device (MLD).

In an embodiment, a wireless access point (AP) includes a controller configured to generate a control signal and a wireless transceiver configured to, in response the control signal, perform an LDPC encoding operation to generate a PPDU with extra LDPC symbol segments and to transmit the PPDU to a non-AP wireless station (STA) device, the PPDU includes a payload that contains a plurality of orthogonal frequency division multiplexing (OFDM) symbols, and the number of the OFDM symbols contained in the payload is equal to or smaller than a predefined threshold.

In an embodiment, the wireless transceiver is further configured to, in response the control signal, determine a number of extra LDPC symbol segments to be included in the PPDU based on different criteria.

In an embodiment, the wireless transceiver is further configured to, in response the control signal, define a 2-bit extra symbol segment field to indicate up to three extra LDPC symbol segments included in the PPDU.

In an embodiment, the wireless transceiver is further configured to, in response to the control signal, add an additional extra LDPC symbol segment in the PPDU when a number of the OFDM symbols contained in the payload is equal to or smaller than a predefined threshold.

In an embodiment, a method for wireless communications involves at a first wireless device, performing an LDPC encoding operation to generate an encoded data unit with extra LDPC symbol segments and from the first wireless device, transmitting the encoded data unit to a second wireless device.

Other aspects in accordance with the invention will become apparent from the following detailed description, taken in conjunction with the accompanying drawings, illustrated by way of example of the principles of the invention.

BRIEF DESCRIPTION OF THE DRAWINGS

FIG. 5 depicts a physical layer protocol data unit (PPDU) encoding parameter table.

FIG. 7 depicts a table for a common field for an Extremely High Throughput (EHT) Single User (SU) transmission and non-orthogonal frequency-division multiple access (OFDMA) transmission to multiple users.

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
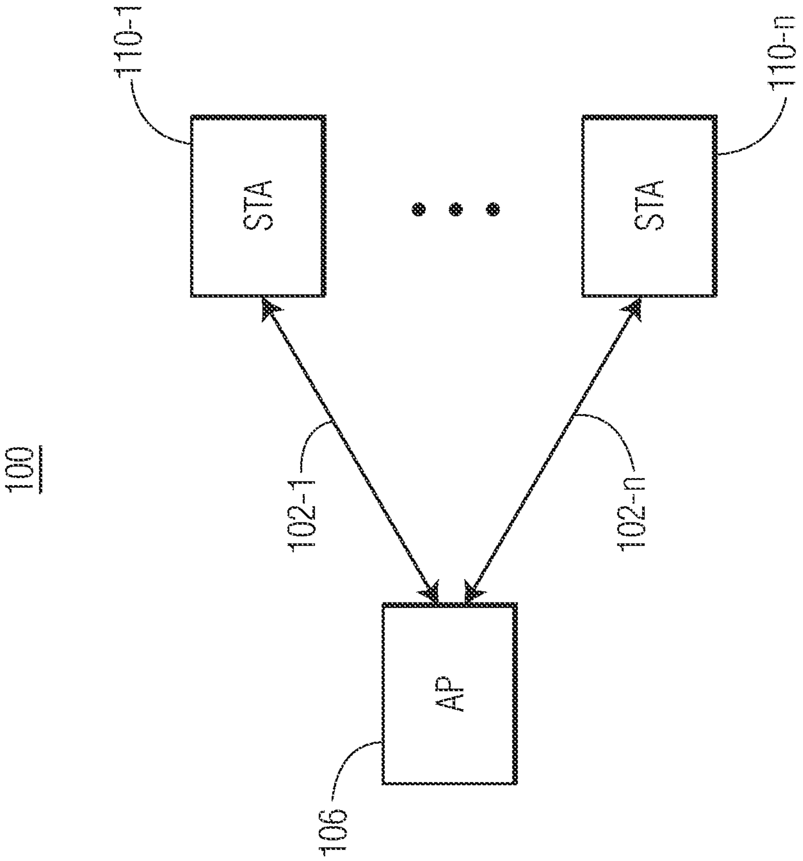
FIG. 1 depicts a wireless communications system in accordance with an embodiment of the invention.

FIG. 1 depicts a wireless (e.g., WiFi) communications system 100 in accordance with an embodiment of the invention. In the embodiment depicted in FIG. 1, the wireless communications system 100 includes at least one AP 106 and at least one station (STA) 110-1, . . . , 110-*n*, where n is a positive integer. The wireless communications system can be used in various applications, such as industrial applications, medical applications, computer applications, and/or consumer or enterprise applications. In some embodiments, the wireless communications system is compatible with an IEEE 802.11 protocol. Although the depicted wireless communications system 100 is shown in FIG. 1 with certain components and described with certain functionality herein, other embodiments of the wireless communications system may include fewer or more components to implement the same, less, or more functionality. For example, in some embodiments, the wireless communications system includes multiple APs with one STA, multiple APs with multiple STAs, one AP with one STA, or one AP with multiple STAs. In another example, although the wireless communications system is shown in FIG. 1 as being connected in a certain topology, the network topology of the wireless communications system is not limited to the topology shown in FIG. 1. In some embodiments, the wireless communications system 100 described with reference to FIG. 1 involves single-link communications and the AP and the STA communicate through single communications links. In some embodiments, the wireless communications system 100 described with reference to FIG. 1 involves multi-link communications and the AP and the STA communicate through multiple communications links. Furthermore, the techniques described herein may also be applicable to each link of a multi-link communications system.

In the embodiment depicted in FIG. 1, the AP 106 may be implemented in hardware (e.g., circuits), software, firmware, or a combination thereof. The AP 106 may be fully or partially implemented as an integrated circuit (IC) device. In some embodiments, the AP 106 is a wireless AP compatible with at least one WLAN communications protocol (e.g., at least one IEEE 802.11 protocol). In some embodiments, the AP is a wireless AP that connects to a local area network (LAN) and/or to a backbone network (e.g., the Internet) through a wired connection and that wirelessly connects to one or more wireless stations (STAs), for example, through one or more WLAN communications protocols, such as the IEEE 802.11 protocol. In some embodiments, the AP includes at least one antenna, at least one transceiver operably connected to the at least one antenna, and at least one controller operably connected to the corresponding transceiver. In some embodiments, the transceiver includes a physical layer (PHY) device. The controller may be configured to control the transceiver to process received packets through the antenna. In some embodiments, the controller is implemented within a processor, such as a microcontroller, a host processor, a host, a digital signal processor (DSP), or a central processing unit (CPU), which can be integrated in a corresponding transceiver. In some embodiments, the AP 106 (e.g., a controller or a transceiver of the AP) implements upper layer Media Access Control (MAC) functionalities (e.g., beacon acknowledgement establishment, reordering of frames, etc.) and/or lower layer MAC functionalities (e.g., backoff, frame transmission, frame reception, etc.). Although the wireless communications system 100 is shown in FIG. 1 as including one AP, other embodiments of the wireless communications system 100 may include multiple APs. In these embodiments, each of the APs of the wireless communications system 100 may operate in a different frequency band. For example, one AP may operate in a 2.4 gigahertz (GHz) frequency band and another AP may operate in a 5 GHz frequency band.

In the embodiment depicted in FIG. 1, each of the at least one STA 110-1, . . . , **110-*n* may be implemented in hardware (e.g., circuits), software, firmware, or a combination thereof. The STA 110-1, . . . , or 110-*n* may be fully or partially implemented as IC devices. In some embodiments, the STA 110-1, . . . , or 110-*n* is a communications device compatible with at least one IEEE 802.11 protocol. In some embodiments, the STA 110-1, . . . , or 110-*n* is implemented in a laptop, a desktop personal computer (PC), a mobile phone, or other communications device that supports at least one WLAN communications protocol. In some embodiments, the STA 110-1, . . . , or 110-*n* implements a common MAC data service interface and a lower layer MAC data service interface. In some embodiments, the STA 110-1, . . . , or 110-*n*** includes at least one antenna, at least one transceiver operably connected to the at least one antenna, and at least one controller connected to the corresponding transceiver. In some embodiments, the transceiver includes a PHY device. The controller may be configured to control the transceiver to process received packets through the antenna. In some embodiments, the controller is implemented within a processor, such as a microcontroller, a host processor, a host, a DSP, or a CPU, which can be integrated in a corresponding transceiver.

In the embodiment depicted in FIG. 1, the AP 106 communicates with the at least one STA 110-1, . . . , **110-*n* via a communication link 102-1, . . . , 102-*n*, where n is a positive integer. In some embodiments, data communicated between the AP and the at least one STA 110-1, . . . , 110-*n*** includes MAC protocol data units (MPDUs). An MPDU may include a frame header, a frame body, and a trailer with the MPDU payload encapsulated in the frame body.

In some embodiments of a wireless communications system, a wireless device, e.g., an access point (AP) multi-link device (MLD) of a wireless local area network (WLAN) may transmit data to at least one associated station (STA) MLD. The AP MLD may be configured to operate with associated STA MLDs according to a communication protocol. For example, the communication protocol may be an Extremely High Throughput (EHT) communication protocol, or Institute of Electrical and Electronics Engineers (IEEE) 802.11be communication protocol. In some embodiments of the wireless communications system described herein, different associated STAs within range of an AP operating according to the EHT communication protocol are configured to operate according to at least one other communication protocol, which defines operation in a Basic Service Set (BSS) with the AP, but are generally affiliated with lower data throughput protocols. The lower data throughput communication protocols (e.g., High Efficiency (HE) communication protocol that is compatible with IEEE 802.11ax standards, Very High Throughput (VHT) communication protocol that is compatible with IEEE 802.11ac standards, etc.) may be collectively referred to herein as "legacy" communication protocols.

Figure 2:
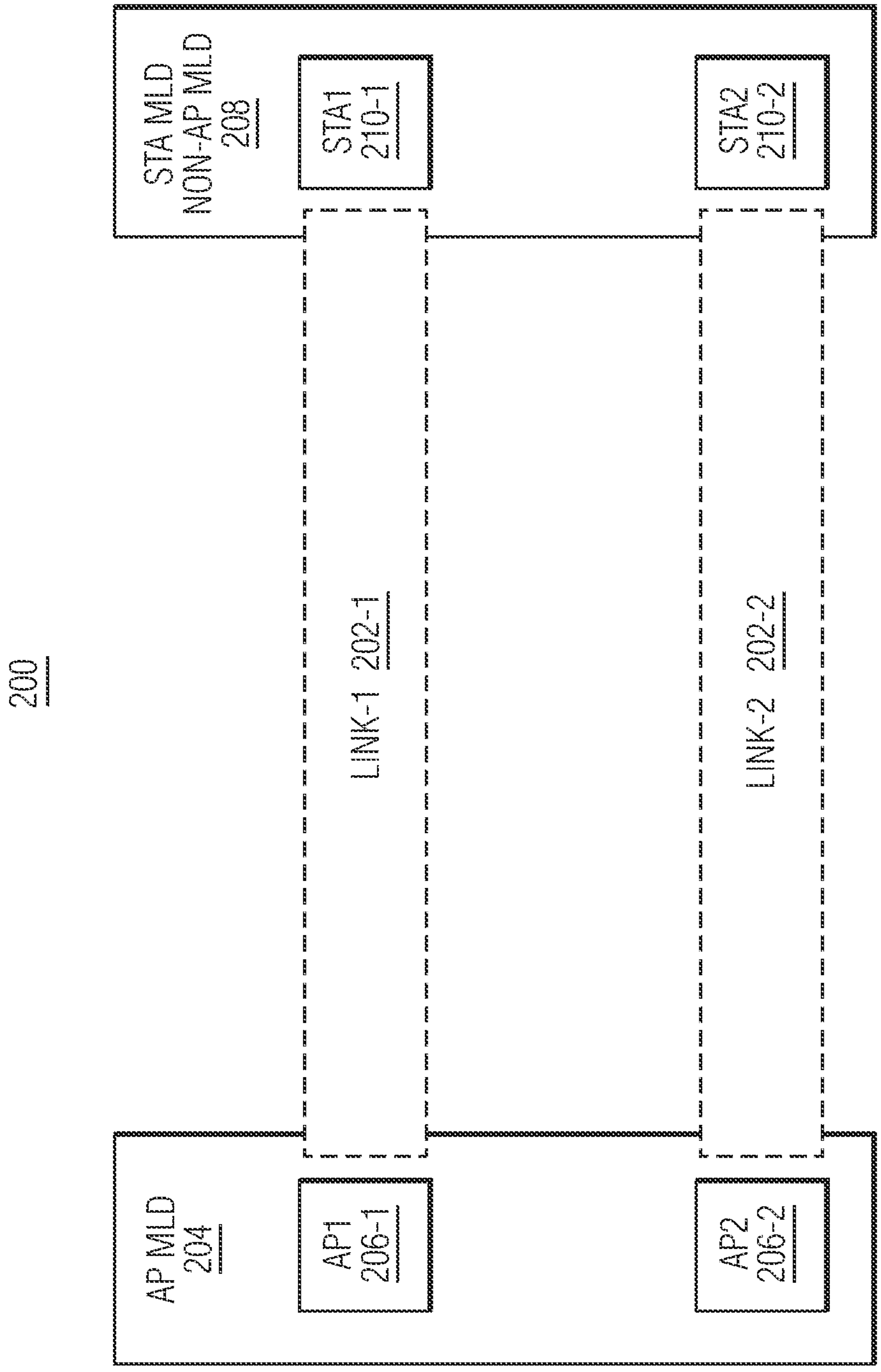
FIG. 2 depicts a multi-link communications system that is used for wireless communications in accordance with an embodiment of the invention.

FIG. 2 depicts a multi-link communications system 200 that is used for wireless (e.g., WiFi) communications in accordance with an embodiment of the invention. In the embodiment depicted in FIG. 2, the multi-link communications system includes one AP multi-link device, which is implemented as AP MLD 204, and one non-AP STA multi-link device, which is implemented as STA MLD 208. The multi-link communications system can be used in various applications, such as industrial applications, medical applications, computer applications, and/or consumer or enterprise applications. In some embodiments, the multi-link communications system may be a wireless communications system, such as a wireless communications system compatible with an IEEE 802.11 protocol. For example, the multi-link communications system may be a wireless communications system compatible with an IEEE 802.11be protocol. Although the depicted multi-link communications system 200 is shown in FIG. 2 with certain components and described with certain functionality herein, other embodiments of the multi-link communications system may include fewer or more components to implement the same, less, or more functionality. For example, in some embodiments, the multi-link communications system includes a single AP MLD with multiple STA MLDs, or multiple AP MLDs with more than one STA MLD. In some embodiments, the legacy STAs (non-HE STAs) may associate with one of the APs affiliated with the AP MLD. In another example, although the multi-link communications system is shown in FIG. 2 as being connected in a certain topology, the network topology of the multi-link communications system is not limited to the topology shown in FIG. 2.

In the embodiment depicted in FIG. 2, the AP MLD 204 includes two radios, implemented as APs 206-1 and 206-2. In such an embodiment, the APs may be AP1 206-1 and AP2 206-2. In some embodiments, a common part of the AP MLD 204 implements upper layer Media Access Control (MAC) functionalities (e.g., beaconing, association establishment, reordering of frames, etc.) and a link specific part of the AP MLD 204, i.e., the APs 206-1 and 206-2, implement lower layer MAC functionalities (e.g., backoff, frame transmission, frame reception, etc.). The APs 206-1 and 206-2 may be implemented in hardware (e.g., circuits), software, firmware, or a combination thereof. The APs 206-1 and 206-2 may be fully or partially implemented as an integrated circuit (IC) device. In some embodiments, the APs 206-1 and 206-2 may be wireless APs compatible with at least one WLAN communications protocol (e.g., at least one IEEE 802.11 protocol). For example, the APs 206-1 and 206-2 may be wireless APs compatible with an IEEE 802.11be protocol. In some embodiments, an AP MLD (e.g., AP MLD 204) connects to a local network (e.g., a LAN) and/or to a backbone network (e.g., the Internet) through a wired connection and wirelessly connects to wireless STAs, for example, through one or more WLAN communications protocols, such as an IEEE 802.11 protocol. In some embodiments, an AP (e.g., AP1 206-1 and/or AP2 106-2) includes at least one antenna, at least one transceiver operably connected to the at least one antenna, and at least one controller operably connected to the corresponding transceiver. In some embodiments, at least one transceiver includes a physical layer (PHY) device. The at least one controller may be configured to control the at least one transceiver to process received packets through the at least one antenna. In some embodiments, the at least one controller may be implemented within a processor, such as a microcontroller, a host processor, a host, a digital signal processor (DSP), or a central processing unit (CPU), which can be integrated in a corresponding transceiver. In some embodiments, each of the APs 206-1 or 206-2 of the AP MLD 204 may operate in a different BSS operating channel. For example, AP1 206-1 may operate in a 320 MHz (one million hertz) BSS operating channel at 6 Gigahertz (GHz) band and AP2 206-2 may operate in a 160 MHz BSS operating channel at 5 GHz band. Although the AP MLD 204 is shown in FIG. 2 as including two APs, other embodiments of the AP MLD 204 may include more than two APs.

In the embodiment depicted in FIG. 2, the non-AP STA multi-link device, implemented as STA MLD 208, includes two radios which are implemented as non-AP STAs 210-1 and 210-2. In such an embodiment, the non-AP STAs may be STA1 210-1 and STA2 210-2. The STAs 210-1 and 210-2 may be implemented in hardware (e.g., circuits), software, firmware, or a combination thereof. The STAs 210-1 and 210-2 may be fully or partially implemented as an IC device. In some embodiments, the non-AP STAs 210-1 and 210-2 are part of the STA MLD 208, such that the STA MLD may be a communications device that wirelessly connects to a wireless AP MLD. For example, the STA MLD 208 may be implemented in a laptop, a desktop personal computer (PC), a mobile phone, or other communications device that supports at least one WLAN communications protocol. In some embodiments, the non-AP STA MLD 208 is a communications device compatible with at least one IEEE 802.11 protocol (e.g., an IEEE 802.11be protocol, an IEEE 802.11ax protocol, or an IEEE 802.11ac protocol). In some embodiments, the STA MLD 208 implements a common MAC data service interface and the non-AP STAs 210-1 and 210-2 implement a lower layer MAC data service interface.

In some embodiments, the AP MLD 204 and/or the STA MLD 208 may identify which communication links support multi-link operation during a multi-link operation setup phase and/or exchanges information regarding multi-link capabilities during the multi-link operation setup phase. In some embodiments, each of the non-AP STAs 210-1 and 210-2 of the STA MLD 208 may operate in a different frequency band. For example, the non-AP STA 210-1 may operate in the 2.4 GHz frequency band and the non-AP STA 210-2 may operate in the 5 GHz frequency band. In some embodiments, each STA includes at least one antenna, at least one transceiver operably connected to the at least one antenna, and at least one controller connected to the corresponding transceiver. In some embodiments, at least one transceiver includes a PHY device. The at least one controller may be configured to control the at least one transceiver to process received packets through the at least one antenna. In some embodiments, the at least one controller may be implemented within a processor, such as a microcontroller, a host processor, a host, a DSP, or a CPU, which can be integrated in a corresponding transceiver.

In the embodiment depicted in FIG. 2, the STA MLD 208 communicates with the AP MLD 204 via two communication links, e.g., link 1 202-1 and link 2 202-2. For example, each of the non-AP STAs 210-1 or 210-2 communicates with an AP 206-1 or 206-2 via corresponding communication links 202-1 or 202-2. In an embodiment, a communication link (e.g., link 1 202-1 or link 2 202-2) may include a BSS operating channel established by an AP (e.g., AP1 206-1 or AP2 206-2) that features multiple 20 MHz channels used to transmit frames (e.g., Physical Layer Convergence Protocol (PLCP) Protocol Data Units (PPDUs), Beacon frames, management frames, etc.) between a first wireless device (e.g., an AP, an AP MLD, an STA, or an STA MLD) and a second wireless device (e.g., an AP, an AP MLD, an STA, or an STA MLD). In some embodiments, a 20 MHz channel may be a punctured 20 MHz channel or an unpunctured 20 MHz channel. Although the STA MLD 208 is shown in FIG. 2 as including two non-AP STAs, other embodiments of the STA MLD 208 may include one non-AP STA or more than two non-AP STAs. In addition, although the AP MLD 204 communicates (e.g., wirelessly communicates) with the STA MLD 208 via the communications links 202-1 and 202-2, in other embodiments, the AP MLD 204 may communicate (e.g., wirelessly communicate) with the STA MLD 208 via more than two communication links or less than two communication links.

In some embodiments, a first MLD, e.g., an AP MLD or non-AP MLD (STA MLD), may transmit management frames in a multi-link operation with a second MLD, e.g., STA MLD or AP MLD, to coordinate the multi-link operation between the first MLD and the second MLD. As an example, a management frame may be a channel switch announcement frame, a (Re) Association Request frame, a (Re) Association Response frame, a Beacon frame, a Disassociation frame, an Authentication frame, and/or a Block Acknowledgement (Ack) (BA) Action frame, etc. In some embodiments, one or more management frames may be transmitted via a cross-link transmission (e.g., according to an IEEE 802.11be communication protocol). As an example, a cross-link management frame transmission may involve a management frame being transmitted and/or received on one link (e.g., link 1 202-1) while carrying information of another link (e.g., link 2 202-2). In some embodiments, a management frame is transmitted on any link (e.g., at least one of two links or at least one of multiple links) between a first MLD (e.g., AP MLD 204) and a second MLD (e.g., STA MLD 208). As an example, a management frame may be transmitted between a first MLD and a second MLD on any link (e.g., at least one of two links or at least one of multiple links) associated with the first MLD and the second MLD.

Figure 3:
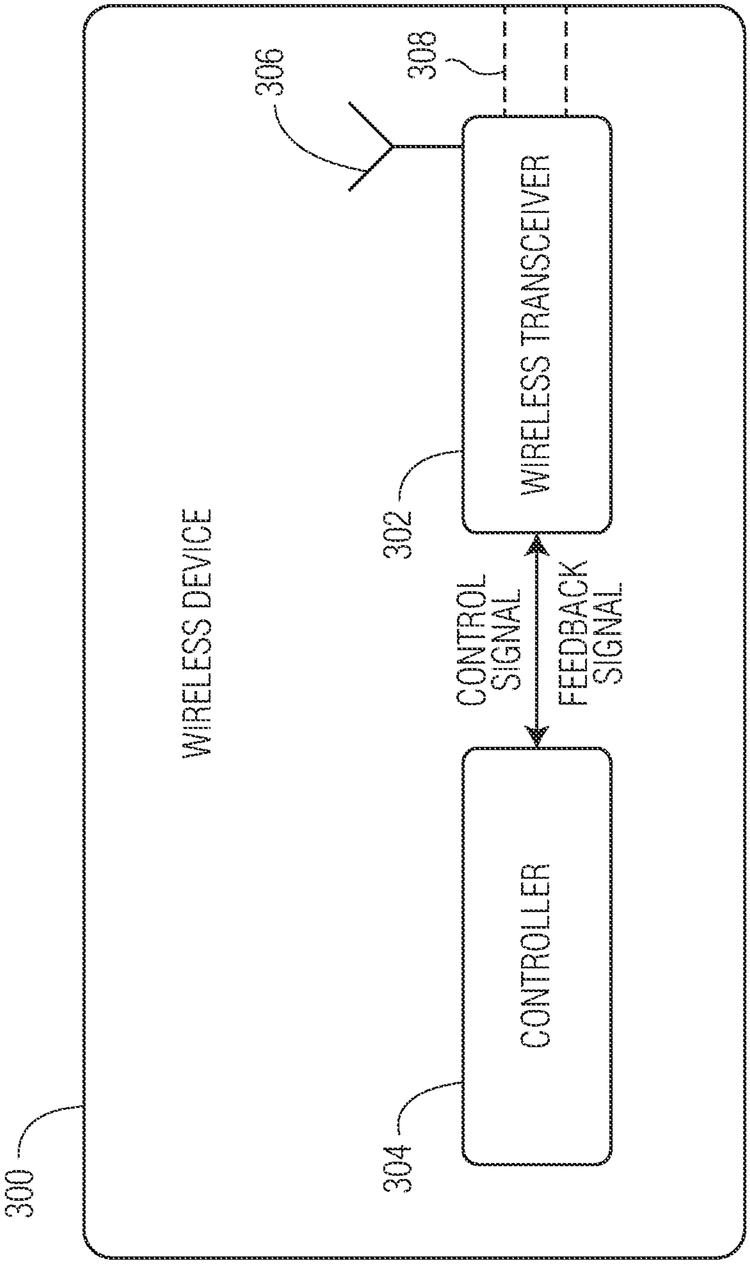
FIG. 3 depicts a wireless device in accordance with an embodiment of the invention.

FIG. 3 depicts a wireless device 300 in accordance with an embodiment of the invention. The wireless device 300 can be used in the wireless communications system 100 depicted in FIG. 1 and/or the multi-link communications system 200 depicted in FIG. 2. For example, the wireless device 300 may be an embodiment of the AP 106 depicted in FIG. 1, the STA 110-1, . . . , **110-*n* depicted in FIG. 1, the APs 206-1, 206-2 depicted in FIG. 2, and/or the STAs 210-1, 210-2 depicted in FIG. 2. In the embodiment depicted in FIG. 3, the wireless device 300 includes a wireless transceiver 302, a controller 304 operably connected to the wireless transceiver, and at least one antenna 306 operably connected to the wireless transceiver. In some embodiments, the wireless device 300 may include at least one optional network port 308 operably connected to the wireless transceiver. In some embodiments, the wireless transceiver includes a physical layer (PHY) device. The wireless transceiver may be any suitable type of wireless transceiver. For example, the wireless transceiver may be a LAN transceiver (e.g., a transceiver compatible with an IEEE 802.11 protocol). In some embodiments, the wireless device 300 includes multiple transceivers. The controller may be configured to control the wireless transceiver (e.g., by generating a control signal) to process packets received through the antenna and/or the network port and/or to generate outgoing packets to be transmitted through the antenna and/or the network port. In some embodiments, the wireless transceiver transmits one or more feedback signals to the controller. In some embodiments, the controller is implemented within a processor, such as a microcontroller, a host processor, a host, a DSP, or a CPU. In some embodiments, the wireless transceiver 302** is implemented in hardware (e.g., circuits), software, firmware, or a combination thereof. The antenna may be any suitable type of antenna. For example, the antenna may be an induction type antenna such as a loop antenna or any other suitable type of induction type antenna. However, the antenna is not limited to an induction type antenna. The network port may be any suitable type of port.

In accordance with an embodiment of the invention, the controller 304 is configured to generate a control signal and the wireless transceiver 302 is configured to, in response to the control signal, perform a low-density parity-check (LDPC) encoding operation to generate an encoded data unit with extra LDPC symbol segments. In some embodiments, the encoded data includes a physical layer protocol data unit (PPDU). In some embodiments, the encoded data includes a payload that contains orthogonal frequency division multiplexing (OFDM) symbols, and the number of the OFDM symbols contained in the payload is equal to or smaller than a predefined threshold. In some embodiments, the predefined threshold is two. In some embodiments, the wireless transceiver is further configured to, in response to the control signal, determine the number of extra LDPC symbol segments to be included in the encoded data unit based on different criteria. In some embodiments, the wireless transceiver is further configured to, in response to the control signal, determine one extra LDPC symbol segment to be included in the encoded data unit based on a first criterion and determine two extra LDPC symbol segments to be included in the encoded data unit based on a second criterion and to determine three extra LDPC symbol segments to be included in the encoded data unit based on a third criterion. In some embodiments, the wireless transceiver is further configured to, in response to the control signal, define an extra symbol segment field to indicate the extra LDPC symbol segments within the encoded data unit. In some embodiments, the wireless transceiver is further configured to, in response to the control signal, define a 2-bit extra symbol segment field to indicate up to three extra LDPC symbol segments included in the encoded data unit. In some embodiments, the wireless transceiver is further configured to, in response to the control signal, determine an adaptive number of extra LDPC symbol segments to be included in the encoded data unit to fill to an end of an orthogonal frequency division multiplexing (OFDM) symbol. In some embodiments, the adaptive number of extra LDPC symbol segments is greater than a threshold, and an extra OFDM symbol is added if an initial number of the extra LDPC symbol segments is less than the threshold. In some embodiments, the wireless transceiver is further configured to, in response to the control signal, add an additional extra LDPC symbol segment in the encoded data unit when the number of the OFDM symbols contained in a payload of the encoded data unit is equal to or smaller than a predefined threshold. In some embodiments, the wireless transceiver is further configured to, in response to the control signal, add an additional extra LDPC symbol segment in the encoded data unit based on a punctured parity bit ratio that is lower than a standard punctured parity bit ratio when a number of the OFDM symbols contained in a payload of the encoded data unit is equal to or smaller than a predefined threshold. In some embodiments, a smallest encoding boundary of a last OFDM data symbol and a size of an LDPC symbol segment is less than a standard value of ¼ of one OFDM symbol. In some embodiments, the wireless device 300 is compatible with an Institute of Electrical and Electronics Engineers (IEEE) 802.11 protocol. In some embodiments, the wireless device is a component of a multi-link device (MLD).

Figure 4:
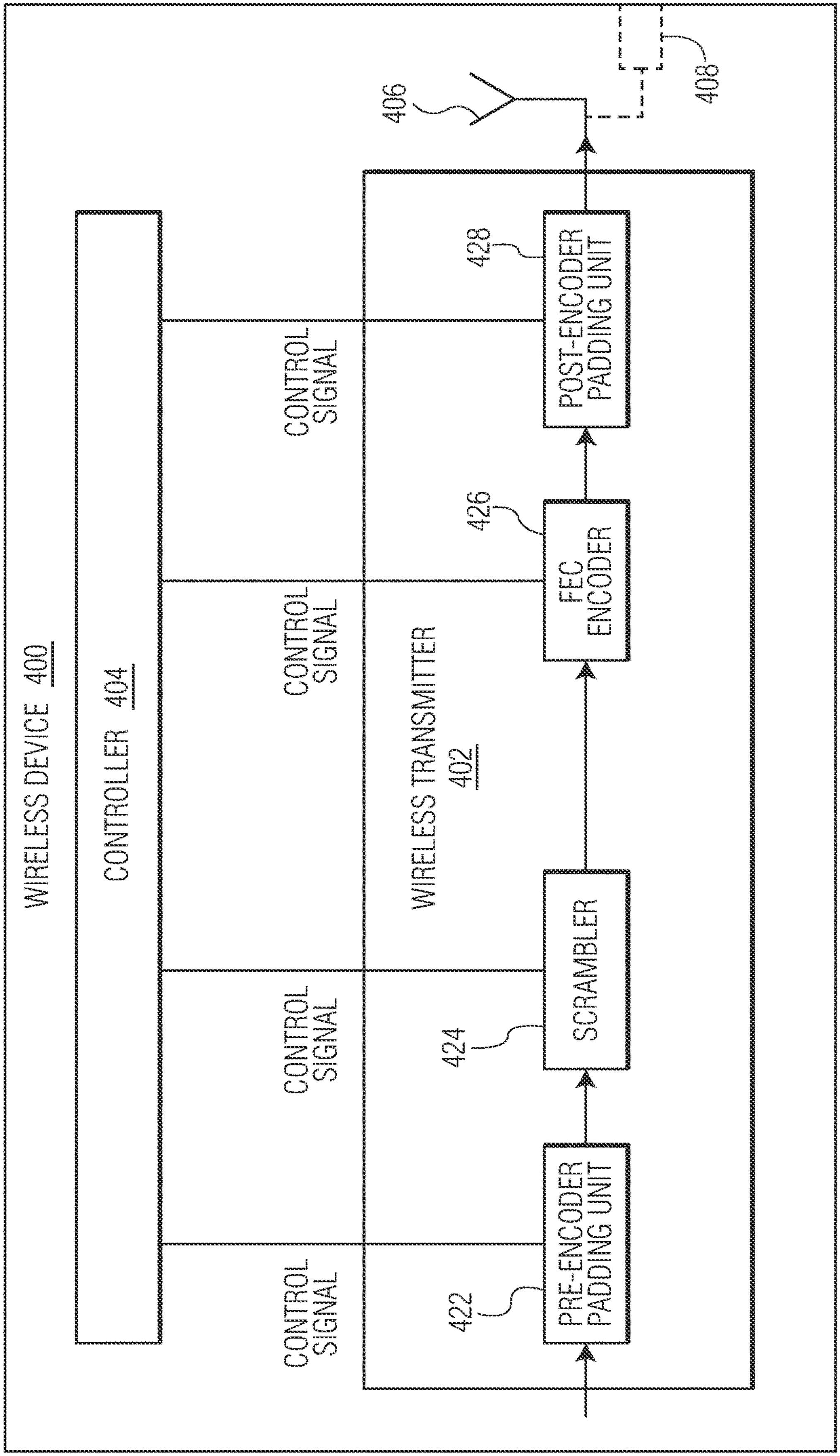
FIG. 4 depicts a wireless device in accordance with an embodiment of the invention.

FIG. 4 depicts a wireless device 400 in accordance with an embodiment of the invention, which is an embodiment of the wireless device 300 depicted in FIG. 3. However, the wireless device 300 depicted in FIG. 3 is not limited to the embodiment depicted in FIG. 4. In the embodiment depicted in FIG. 4, the wireless device 400 includes a wireless transceiver 402, a controller 404 operably connected to the wireless transceiver, and at least one antenna 406 operably connected to the wireless transceiver. In some embodiments, the wireless device 400 may include at least one optional network port 408 operably connected to the wireless transceiver. The wireless transmitter 402, the controller 404, the antenna 406, and the network port 408 of the wireless device 400 depicted in FIG. 4 may be an embodiment or a component of the wireless transceiver 302, the controller 304, the antenna 306, and the network port 308 of the wireless device 300 depicted in FIG. 3. However, the wireless transceiver 302, the controller 304, the antenna 306, and the network port 308 depicted in FIG. 3 is not limited to the embodiments depicted in FIG. 4. In some embodiments, the controller is implemented within a processor, such as a microcontroller, a host processor, a host, a DSP, or a CPU. In some embodiments, the wireless transceiver is implemented in hardware (e.g., circuits), software, firmware, or a combination thereof. The antenna may be any suitable type of antenna. For example, the antenna may be an induction type antenna such as a loop antenna or any other suitable type of induction type antenna. However, the antenna is not limited to an induction type antenna. The network port may be any suitable type of port.

In the embodiment depicted in FIG. 4, the wireless transmitter 402 includes a pre-encoder padding unit 422, a scrambler 424, at least one forward error correction (FEC) encoder (e.g., a low-density parity-check (LDPC) encoder) 426, and a post-encoder padding unit 428. In some embodiments, the wireless transmitter is included in a wireless communications device (e.g., the wireless device 400 depicted in FIG. 4), such as a wireless communications device compatible with an Institute of Electrical and Electronics Engineers (IEEE) 802.11 protocol. Although the depicted wireless transmitter 402 is shown in FIG. 4 with certain components and described with certain functionality herein, other embodiments of the wireless transmitter 402 may include fewer or more components to implement the same, less, or more functionality. For example, although the wireless transmitter 402 is shown in FIG. 4 includes the FEC encoder 426, in other embodiments, the wireless transmitter 402 includes multiple FEC encoders. In another example, although the wireless transmitter 402 is shown in FIG. 4 as being connected in a certain topology, the network topology of the wireless transmitter 402 is not limited to the topology shown in FIG. 4. In some embodiments, the pre-encoder padding unit 422 is configured to perform a padding operation on input data to generate padded input data, the scrambler 424 is configured to perform a scramble operation on padded input data to generate scrambled input data, the at least one FEC encoder 426 is configured to perform an encoding operation on the scrambled input data to generated encoded data, and the post-encoder padding unit 428 is configured to perform a padding operation on encoded data to generate padded encoded data. In some embodiments, the wireless transmitter 402 includes a stream parser configured to perform a stream parser operation, a segment parser configured to perform a segment parser operation, and/or a LDPC tone mapper configured to perform a tone mapping operation.

In some embodiments, the controller 404 is configured to generate a control signal and the wireless transmitter 402 (e.g., the FEC encoder 426) is configured to, in response to the control signal, perform a low-density parity-check (LDPC) encoding operation to generate an encoded data unit with extra LDPC symbol segments. In some embodiments, the encoded data includes a physical layer protocol data unit (PPDU). In some embodiments, the encoded data includes a payload that contains orthogonal frequency division multiplexing (OFDM) symbols, and the number of the OFDM symbols contained in the payload is equal to or smaller than a predefined threshold. In some embodiments, the predefined threshold is two. In some embodiments, the wireless transmitter 402 is further configured to, in response to the control signal, determine the number of extra LDPC symbol segments to be included in the encoded data unit based on different criteria. In some embodiments, the wireless transmitter 402 is further configured to, in response to the control signal, determine two extra LDPC symbol segments to be included in the encoded data unit based on a first criterion and to determine three extra LDPC symbol segments to be included in the encoded data unit based on a second criterion. In some embodiments, the wireless transmitter 402 is further configured to, in response to the control signal, define an extra symbol segment field to indicate the extra LDPC symbol segments within the encoded data unit. In some embodiments, the wireless transmitter 402 is further configured to, in response to the control signal, define a 2-bit extra symbol segment field to indicate up to three extra LDPC symbol segments included in the encoded data unit. In some embodiments, the wireless transmitter 402 is further configured to, in response to the control signal, determine an adaptive number of extra LDPC symbol segments to be included in the encoded data unit to fill to an end of an orthogonal frequency division multiplexing (OFDM) symbol. In some embodiments, the wireless transmitter 402 is further configured to, in response to the control signal, add an additional extra LDPC symbol segment in the encoded data unit when the number of parity bits to be punctured is greater than zero and the number of the OFDM symbols contained in a payload of the encoded data unit is equal to or smaller than a predefined threshold. In some embodiments, the wireless transmitter 402 is further configured to, in response to the control signal, add an additional extra LDPC symbol segment in the encoded data unit based on a punctured parity bit ratio that is lower than a standard punctured parity bit ratio when a number of the OFDM symbols contained in a payload of the encoded data unit is equal to or smaller than a predefined threshold.

In some embodiments, the controller 404 determines the number of pre-encoding padding bits based on the number of excess information bits that do not fit into a minimum integer number of orthogonal frequency division multiplexing (OFDM) symbols. The pre-encoder padding unit 422 may add a number $N_{PAD1}$ of padding bits to information bits such that, after being encoded by the at least one FEC encoder 426, the coded bits may fill the last OFDM symbol up to a first portion of the last OFDM symbol. The post-encoder padding unit 428 may add a number $N_{PAD2}$ of padding bits to the coded information bits such that the coded information bits completely fill the entire last OFDM symbol, in an embodiment. For example, after being encoded by the FEC encoder(s) 426, coded bits are provided to the post-encoder padding unit 428, which pads the coded bits such that the coded bits completely fill an entire last OFDM symbol. In an embodiment, the post-encoding padding unit adds the number of padding bits $N_{PAD2}$ (e.g., determined according to Equation 9 in an IEEE 802.11n standard).

In an IEEE 802.11n standard, some LDPC operations are described. To encode an LDPC PPDU, step a) to step g) shall be performed in sequence:

a) Compute the number of available bits, $N_{avbits}$, in the minimum number of OFDM symbols in which the Data field of the packet may fit, for example, in Equation (19-35) and Equation (19-36).

$$N_{pld} = \text{length} \times 8 + 16 \tag{19-35}$$

$$N_{avbits} = N_{CBPS} \times m_{STBC} \times \left\lceil \frac{N_{pld}}{N_{CBPS} \times R \times m_{STBC}} \right\rceil \tag{19-36}$$

where $m_{STBC}$ is 2 if STBC is used and 1 otherwise;

length is the value of the High Throughput (HT) Length field in the HT-SIG (signal field);

$N_{pld}$ is the number of bits in the Physical Layer Convergence Protocol (PLCP) service data unit (PSDU) and SERVICE field; R is the coding rate.

b) Compute the integer number of LDPC codewords to be transmitted, $N_{CW}$, and the length of the codewords to be used, $L_{LDPC}$ from a PPDU encoding parameter table (Table 19-16). FIG. 5 depicts the PPDU encoding parameter table (Table 19-16)).

c) Compute the number of shortening bits, $N_{shrt}$, to be padded to the $N_{pld}$ data bits before encoding, as shown in Equation (19-37).

$$N_{shrt} = \max(0, (N_{CW} \times L_{LDPC} \times R) - N_{pld}) \tag{19-37}$$

When Nshrt=0, shortening is not performed. (Note that Nshrt is inherently restricted to be non-negative due to the codeword length and count selection of Table 19-16). When Nshrt>0, shortening bits shall be equally distributed over all $N_{CW}$ codewords with the first Nshrt mod $N_{CW}$ codewords shortened 1 bit more than the remaining codewords. Define $N_{spcw}$=[Nshrt/$N_{CW}$]. Then, when Nshrt>0, the shortening is performed by setting information bits $i_{k-Nspcw-1}, \ldots, i_{k-1}$ to 0 in the first Nshrt mod $N_{CW}$ codewords and setting information bits $i_{k-Nspcw}, \ldots, i_{k-1}$ to 0 in the remaining codewords. For all values of $N_{shrt}$, encode each of the New codewords using the LDPC encoding technique described in 19.3.11.7.2 to 19.3.11.7.4. When Nshrt>0, the shortened bits shall be discarded after encoding.

d) Compute the number of bits to be punctured, $N_{punc}$, from the codewords after encoding, as shown in Equation (19-38).

$$N_{punc} = \max(0, (N_{CW} \times L_{LDPC}) - N_{avbits} - N_{shrt}) \tag{19-38}$$

Check whether $((N_{punc}>0.1\times N_{CW}\times L_{LDPC}\times(1-R)))$ AND $(N_{shrt}<1.2\times N_{punc}\times R/1-R))$ is true OR if $(N_{punc}>0.3\times N_{CW}\times L_{LDPC}\times(1-R\ R))$ is true (where $N_{punc}$ is the number of punctured parity bits, $N_{CW}\times L_{LDPC}\times(1-R)$ equals the total number of parity bits, $N_{shrt}$ is the number of shortening bits (known information bits), and R is the code rate), increment $N_{avbits}$ and recompute $N_{punc}$ by the $$N_{avbits} = N_{avbits} + N_{CBPS} \times m_{STBC} \quad (19\text{-}39)$$

$$N_{punc} = \max(0, (N_{CW} \times L_{LDPC}) - N_{avbits} - N_{shrt}) \quad (19\text{-}40)$$

The punctured bits shall be equally distributed over all New codewords with the first $N_{punc}$ mod $N_{CW}$ codewords punctured 1 bit more than the remaining codewords.

Define $N_{ppcw}=[N_{punc}/N_{CW}]$. When $N_{ppcw}>0$, the puncturing is performed by discarding parity bits $p_{n\text{-}k\text{-}Npcw-1}, \ldots p_{n\text{-}k-1}$ of the first $N_{punc}$ mod New codewords and discarding parity bits $(p_{n\text{-}k\text{-}Nppcw}, \ldots p_{n\text{-}k-1})$ of the remaining codewords after encoding. The number of OFDM symbols to be transmitted in the PPDU is computed as shown in Equation (19-41).

$$N_{SYM} = N_{avbits} / N_{CBPS} \quad (19\text{-}41)$$

e) Compute the number of coded bits to be repeated, $N_{rep}$, as shown in Equation (19-42).

$$N_{rep} = \max(0, N_{avbits} - N_{CW} \times L_{LDPC} \times (1 - R) - N_{pld}) \quad (19\text{-}42)$$

The number of coded bits to be repeated shall be equally distributed over all New codewords with one more bit repeated for the first $N_{rep}$ mod $N_{CW}$ codewords than for the remaining codewords.

f) For each of the New codewords, process the data using the number of shortening bits per codeword as computed in step c) for encoding, and puncture or repeat bits per codeword as computed per step d) and step e).

g) Aggregate all codewords and parse as defined in 19.3.11.7.

Starting from an IEEE 802.11ac standard, $N_{pld}$ is redefined to match $N_{sym.init}$. For small payload (small APEP_LENGTH number) and large $N_{DBPS}$ (e.g., the number of data bits per OFDM symbol), the ceiling operation will cause large number of pre-FEC padding.

For a VHT SU PPDU using LDPC coding to encode the Data field, the LDPC code and encoding process described in 19.3.11.7 shall be used with the following modifications. First, all bits in the Data field including the scrambled SERVICE, PSDU, and pad bits are encoded. Thus, $N_{pld}$ for VHT PPDUs shall be computed using Equation (21-61) instead of Equation (19-35).

$$N_{pld} = N_{SYM,\ init} N_{DBPS} \quad (21\text{-}61)$$

where $N_{sym.init}$ is given by Equation (21-62)

$$N_{SYM,\ init} = m_{STBC} \times \left\lceil \frac{8 \cdot \text{APEP\_LENGTH} + N_{service}}{m_{STBC} \cdot N_{DBPS}} \right\rceil \quad (21\text{-}62)$$

where $m_{STBC}$ is equal to 2 when STBC is used, and 1 otherwise, APEP_LENGTH is the TXVECTOR parameter.

IEEE 802.11ax/be standards updates the definition with a factor for the last symbol but inherits similar pre-FEC padding mechanism to one of the a factors. For an HE SU PPDU and HE Extended-Range (ER) SU PPDU, the number of pre-FEC pad bits is calculated using Equation (27-63).

$$N_{PAD,\ Pre\text{-}FEC} = (N_{SYM,\ init} - m_{STBC})N_{DBPS} + m_{STBC}N_{DBPS,\ last,\ init} - 8 \cdot \text{APEP\_LENGTH} - N_{Tail} - N_{service} \quad (27\text{-}63)$$

where $N_{SYM,init}$ is the initial number of data OFDM symbols with binary convolutional code (BCC) or LDPC encoding in a High Efficiency (HE) SU PPDU or HE ER SU PPDU as defined by Equation (27-64).

$$N_{SYM,\ init} = m_{STBC} \cdot \left\lceil \frac{8 \cdot \text{APEP\_LENGTH} + N_{Tail} + N_{service}}{m_{STBC} N_{DBPS}} \right\rceil \quad (27\text{-}64)$$

Where the payload is based on a factor of the last symbol First, all bits in the Data field including the scrambled SERVICE, PSDU, and pre-FEC pad bits are encoded. Thus, $N_{pld}$ for HE PPDUs shall be computed using Equation (27-68).

$$N_{pld} = (N_{SYM,\ init} - m_{STBC})N_{DBPS} + m_{STBC}N_{DBPS,\ last,\ init} \quad (27\text{-}68)$$

where $N_{SYM,init}$ is defined in Equation (27-64).

Figure 6:
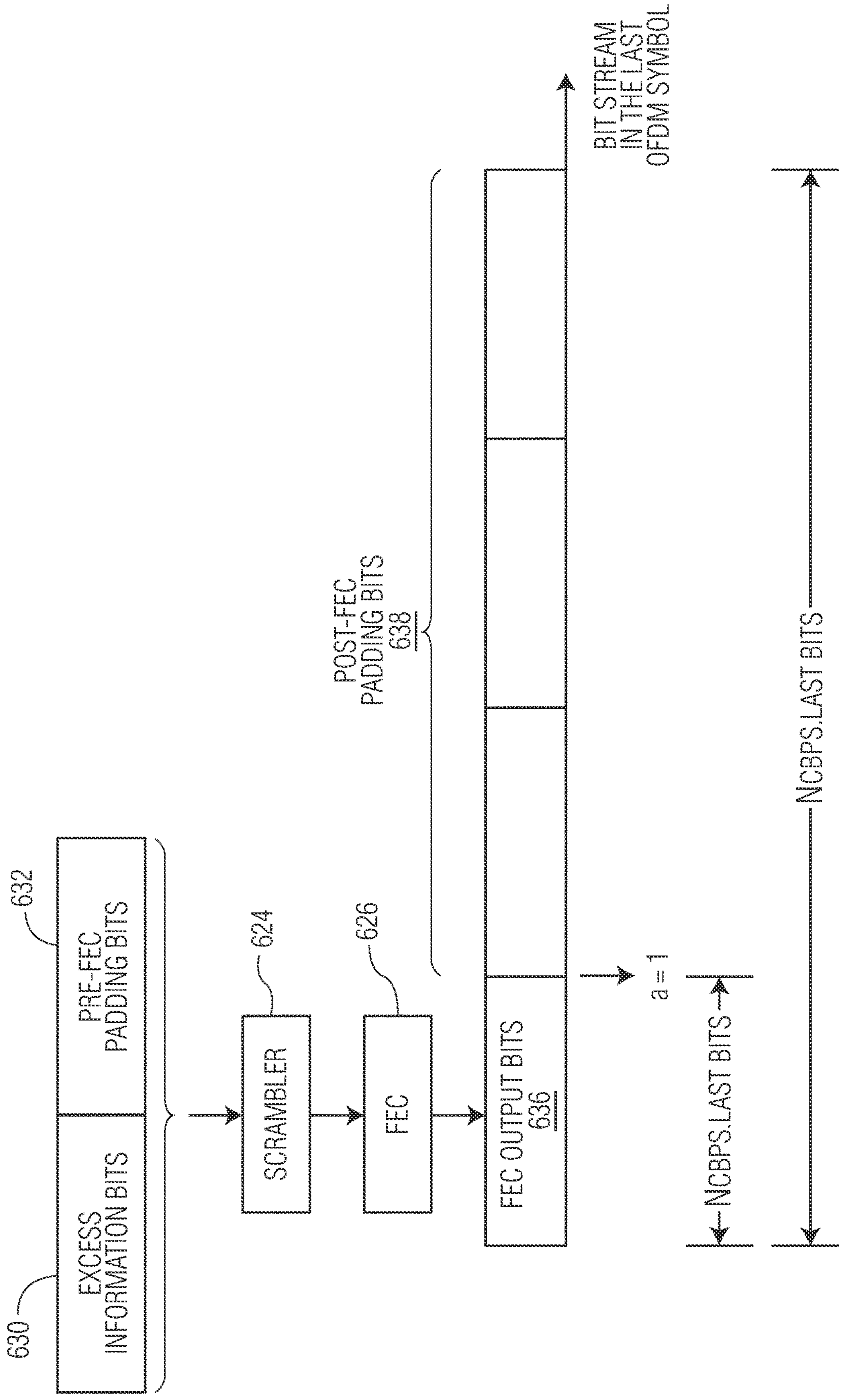
FIG. 6 illustrates a forward error correction (FEC) process.

FIG. 6 illustrates a FEC process. In the FEC process illustrated in FIG. 6, FEC output bits 636 with post-FEC padding bits 638 are produced based on excess information bits 630 and pre-FEC padding bits 632, for example, using a scrambler 624 and a FEC encoder (shown as FEC in FIG. 6) 636. In some embodiments, in the case of Space time block coding (STBC), the FEC output bits and post-FEC padding bits are modulated into the last two OFDM symbols by STBC encoding, each with the same pre-FEC padding boundary.

Extra segment signaling may be implemented. For example, 1 bit is added in the SIG field to indicate the existence of the extra segment for a receiver to interpret the encoding parameters. FIG. 7 depicts a table for a common field for an EHT SU transmission and non-OFDMA transmission to multiple users (Table 36-36). As depicted in FIG. 7, an LDPC extra symbol segment filed (e.g., 1-bit) specifies the presence of an extra OFDM symbol segment for LDPC in a frame (e.g., a trigger-based (TB) PPDU), which can be used for decoding PLCP service data unit (PSDU) bits.

When LDPC is used as FEC for short data packets, small variations of data packet lengths incur large swing of receiver Rx sensitivity requirements at Packet Error Rate (PER) 10%, up to 5-6 decibel (dB) as observed in simulation results and field tests. As described previously, a standard LDPC encoding process step d) may check whether the number of punctured parity bits is excessive. Specifically, it checks whether more than 10% parity bits are punctured while the number of known information bits are not enough to recover the punctured parity bits, or more than 30% parity bits are punctured. If either condition is met, an extra LDPC symbol segment is added to the total number of coded bits to reduce the number of punctured parity bits. Meeting or not meeting this condition makes a significant impact on PER performance when data packet length is relatively short. For example, for one short packet data length, the above condition is met and the number of coded bits in an extra LDPC symbol segment is comparable to the original total number of coded bits $N_{avbits}$, resulting in no parity bits to be punctured and many code bits to be repeated. For another short packet data length, which is a few bytes different than the first data packet length, the number of punctured parity bits may be just slightly below the 10% threshold, hence no extra LDPC symbol segment is added. The effective code rate $$R_{eff} = \frac{N_{pld}}{N_{avbits} - N_{rep}}$$

and the effective SNR of each code bit (repeated code bits have higher effective SNR via combining) are significantly different between the two data packets, which results in large Rx sensitivity gap between the two data packets. The large Rx sensitivity gap up to 5-6 dB due to small variations of the short data packet lengths poses a challenge in link adaptation. The rate adaptation cannot find a converged MCS to cover the large Rx sensitivity gap if the lengths of contiguous short data packets have small variations, resulting in throughput loss.

To overcome the large Rx sensitivity gap from small data packet length variations in short data packet transmissions, two options can be considered. In a first option, an extra LDPC symbol segment is added regardless the condition in LDPC encoding process step d) shown below is met or not if $N_{punc}>0$ and the transmitter identifies that the data packet length meets the short data packet criteria, e.g., the number of OFDM symbol(s) for data transmission is less than a pre-determined number. In a second option a lower punctured parity bits ratio threshold (e.g., 5% or lower number) is used, instead of 10% as in the current step d) condition check to increase the probability of adding an extra LDPC symbol segment and improve PER performance for more data packet lengths if transmitter identifies that the data packet length meets the short data packet criteria. Step d) checks whether $$(N_{punc} > 0.1 \times N_{CW} \times L_{LDPC} \times (1 - R)) \text{ AND } \left(N_{shrt} < 1.2 \times N_{punc} \times \frac{R}{1 - R}\right)$$

is true, OR $N_{punc}>0.3\times N_{CW}\times L_{LDPC}\times(1-R)$ is true, where $N_{punc}$ is the number of punctured parity bits, $N_{CW}\times L_{LDPC}\times(1-R)$ equals the total number of parity bits, $N_{shrt}$ is the number of shortening bits (known information bits), and R is the code rate. By adding an extra LDPC symbol segment for small data packets, the effective code rate $$R_{eff} = \frac{N_{pld}}{N_{avbits} - N_{rep}}$$

($N_{pld}$ is the number of LDPC encoder input information bits, $N_{avbits}$ is the number of LDPC encoder output code bits after adding an extra symbol segment, $N_{rep}$ is the number of repeated code bits) and effective SNR of each code bit no longer vary much when data packet lengths have small variations since an extra symbol segment coded bits (around $N_{CBPS,short}$ parity bits plus repeated code bits if present) are added for all small data packets. The Rx sensitivity change is more gradual when data packet length increases, and rate adaptation can adjust fast enough to the gradual Rx sensitivity change due to small data packet length variations. The other benefit of adding an extra LDPC symbol segment when data packet is relatively short is that the effective code rate is lowered due to added parity bits, and effective SNRs of repeated code bits if present are improved, resulting in better PER performance. When a data packet is extremely short, e.g., the total number of coded bits only fill in one symbol segment, adding an extra symbol segment results in no parity bits to be punctured and many code bits to be repeated. The longer the data packet, the smaller the benefit of adding LDPC extra symbol segment.

In some embodiments, to overcome the large Rx sensitivity gap from small data packet length variations in short data packet transmissions, another option to increase the probability of adding extra symbol segment can be done via modifying the definition of number of data bits at LDPC encoder input, $N_{pld}$. Current standard definition of $$N_{pld} = \begin{cases} N_{SYM} \cdot N_{DBPS}, \text{ if } a_{init} = 4 \\ (N_{SYM} - 1) \cdot N_{DBPS} + a_{init} \cdot N_{DBPS,short}, \end{cases}$$

otherwise which includes pre-FEC padding bits. The actual data bits may be less than $N_{pld}$. For example, the number of real data bits can be $(N_{SYM}-1)\cdot N_{DBPS}+(\alpha_{init}-1)\cdot N_{DBPS,short}+1$, and $N_{DBPS,short}-1$ bits are pre-FEC padding bits. By modifying $N_{pld}$ definition to be close to the actual number of data bits before pre-FEC padding, the parameters used in LDPC encoding can be changed accordingly. Since $N_{avbits}$ definition is not proposed, the effective code rate $$R_{eff} = \frac{N_{pld}}{N_{avbits} - N_{rep}}$$

is lowered intuitively, which can improve the PER performance. Specifically, a finer granularity than $N_{DBPS,short}$, e.g., $N_{DBPS,short}/K$ where K>1 is a divisor of $N_{DBPS,short}$, to define $$N_{pld} = (N_{SYM} - 1) \cdot N_{DBPS} + (a_{init} - 1) \cdot N_{DBPS,short} + b \cdot N_{DBPS,short}/K,$$

$$\text{where } b = \left\lceil \frac{N_{data} - (N_{SYM} - 1) \cdot N_{DBPS} + (a_{init} - 1) \cdot N_{DBPS,short}}{N_{DBPS,short}/K} \right\rceil, 0 < b \le K,$$

and $N_{data}$ is the actual number of data bits before pre-FEC padding. With the modification of $N_{pld}$, the chance of $N_{punc}$ meeting the condition in LDPC encoding process step d) is statistically increased, hence the higher possibility of adding an extra LDPC symbol segment in the total number of coded bits.

Figure 8:
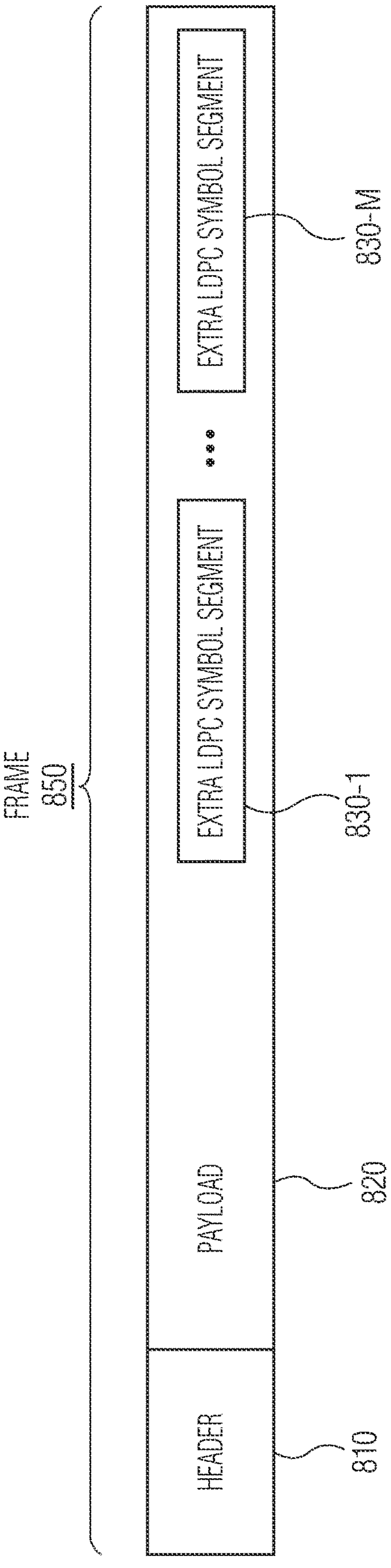
FIG. 8 depicts a frame that includes multiple extra LDPC symbol segments.

In accordance with an embodiment with the invention, more than one extra segments are defined in the LDPC encoding process, for example, by or using a wireless transceiver (e.g., the wireless transmitter 402 depicted in FIG. 4). In some embodiments, $N_{avbits}$ (e.g., the number of available bits in the minimum number of OFDM symbols in which the Data field of a packet may fit) is computed corresponding to a factor in the last symbol (e.g., the last OFDM symbol). In a typical encoding procedure d), only one extra segment is allowed regardless of the puncture ratio. FIG. 8 depicts a frame 850 that includes multiple extra LDPC symbol segments 830-1, . . . , 830-M, where M is a positive integer that is greater than one. In the embodiment depicted in FIG. 8, the frame 850 (e.g., a PPDU) includes a header 810 and a payload 820, which includes the extra LDPC symbol segments 830-1, . . . , 830-M.

For example, in a first option, up to 3 extra LDPC symbol segments are added, for example, by or using a wireless transceiver (e.g., the wireless transmitter 402 depicted in FIG. 4). In some embodiments, multiple extra segment criteria are defined, each corresponding to one to three extra LDPC symbol segments, for example, by or using a wireless transceiver (e.g., the wireless transmitter 402 depicted in FIG. 4). For example, for step d), if $$(N_{punc} > a1 \times N_{CW} \times L_{LDPC} \times (1-R)) \text{ AND } \left(N_{shrt} < b1 \times N_{punc} \times \frac{R}{1-R}\right)$$

is true OR $N_{punc} > c1 \times N_{CW} \times L_{LDPC} \times (1-R)$ is true, add 3 extra segments;

if $$(N_{punc} > a2 \times N_{CW} \times L_{LDPC} \times (1-R)) \text{ AND } \left(N_{shrt} < b2 \times N_{punc} \times \frac{R}{1-R}\right)$$

is true OR $N_{punc} > c2 \times N_{CW} \times L_{LDPC} \times (1-R)$ is true, add 2 extra segment;

if $$(N_{punc} > a3 \times N_{CW} \times L_{LDPC} \times (1-R)) \text{ AND } \left(N_{shrt} < b3 \times N_{punc} \times \frac{R}{1-R}\right)$$

is true OR $N_{punc} > c3 \times N_{CW} \times L_{LDPC} \times (1-R)$ is true, add 1 extra segment. In some embodiments, a 2-bit extra symbol segment field is defined by, for example, by or using a wireless transceiver (e.g., the wireless transmitter 402 depicted in FIG. 4), to indicate 0 to 3 extra segments, increased from 1-bit "extra symbol segment" in IEEE 802.11ax/be standards. In some embodiments, more extra LDPC symbol segments may only be allowed for short payload, e.g., when the number of data OFDM symbols in a PPDU $N_{sym}$<=2. In some embodiments, the maximum extra segment is still one for large payload. However, for small payload length, the criteria for extra segment can be relaxed, e.g., if $N_{sym}$<=2, if $$(N_{punc} > a1 \times N_{CW} \times L_{LDPC} \times (1-R)) \text{ AND } \left(N_{shrt} < b1 \times N_{punc} \times \frac{R}{1-R}\right)$$

is true OR $N_{punc} > c1 \times N_{CW} \times L_{LDPC} \times (1-R)$ is true, add extra segment; else, if $$(N_{punc} > a2 \times N_{CW} \times L_{LDPC} \times (1-R)) \text{ AND } \left(N_{shrt} < b2 \times N_{punc} \times \frac{R}{1-R}\right)$$

is true UK $N_{punc} > c2 \times N_{CW} \times L_{LDPC} \times (1-R)$ is true, add extra segment.

For example, in a second option, one extra LDPC symbol segment is replaced with two extra LDPC symbol segments if the code is over punctured, for example, by or using a wireless transceiver (e.g., the wireless transmitter 402 depicted in FIG. 4). In some embodiments, in signaling, 1-bit is sufficient. However, the meaning of the bit is different for different payload length. For example, 2 extra LDPC symbol segments are used if specific short length criteria is met, e.g., when $N_{sym}$<=2. In another example, 1 extra LDPC symbol segment is used if specific length criteria is not met.

Some examples of transmitter (Tx)/receiver (Rx) coding parameter change are described. In some embodiments, for encoding parameter, step d), if n extra LDPC symbol segment are added (e.g., by or using a wireless transceiver (e.g., the wireless transmitter 402 depicted in FIG. 4)) as defined by Equation (100):

$$N_{avbits} = \begin{cases} N_{SYM,init} \cdot N_{CBPS} + N_{CBPS,last}, & a_{init} + n \leq 4 \\ (N_{SYM,init} + 1) \cdot N_{CBPS} +, N_{CBPS,last} & a_{init} + n > 4 \end{cases} \quad (100)$$

where $N_{CBPS,last} =$ $$\begin{cases} N_{CBPS}, & \text{if } \bmod(a_{init} + n, 4) == 0 \\ \bmod(a_{init} + n, 4) \cdot N_{CBPS,short}, & \text{if } \bmod(a_{init} + n, 4) > 0 \end{cases} \quad (101)$$

as defined by Equation (101). In some embodiments, for Rx decoding parameter, n extra segment is read from the SIG field as defined by Equation (102)

(102)

Where $N_{DBPS,last} =$ $$\begin{cases} N_{DBPS}, & \text{if } \bmod(a_{init} + n, 4) == 0 \\ \bmod(a_{init} + n, 4) \cdot N_{DBPS,short}, & \text{if } \bmod(a_{init} + n, 4) > 0 \end{cases}$$

In some embodiments, if more extra segment only applied to short payloads,

Tx: the condition of $N_{SYM,init} \leq$N_threshold needs to added to Tx equation, and Rx: the condition of $N_{SYM}$ check needs to be added to Rx equation if $\alpha_{init}$+n≤4, $N_{SYM}$<N_threshold, if $\alpha_{init}$+n>4, $N_{SYM}$-1<N_threshold.

In some embodiments, an adaptive number of extra LDPC symbol segments are used to fill to the end of the 4× OFDM symbol, e.g., by or using a wireless transceiver (e.g., the wireless transmitter 402 depicted in FIG. 4). For example, regardless of the a_init value, the initial $N_{avbits}$ always corresponds to one full OFDM symbol of the last symbol. In some embodiments, if step d) check needs more $N_{avbits}$, one full OFDM symbol is added. In some embodiments, extra conditions can be added to step d). For example, the number of extra segments may have a minimum value. In a first option, a fixed value is used for all payload length, e.g., two segments. For example, if the number of the segments is less than the threshold, another 4× OFDM symbol is added. In a second option, the "min extra segment" can be payload length dependent. For example, if $N_{sym\_init}$<=2, "min extra segment"==2, else "min extra segment"=1. In a third option, the "min extra segment" can be dependent on the puncture ratio. For signaling, a 2-bit "pre-FEC padding factor" can be used. In some embodiments, a 1-bit "extra symbol" can be signaled to simplify Rx processing.

Some examples of transmitter (Tx)/receiver (Rx) coding parameter change are described. Tx encoding and Rx decoding process needs to be updated correspondingly. For example, minimum extra segments being fixed as two is used as an example. In encoding process, $N_{pld}$ is computed as in an IEEE 802.11ax/be standard, as defined in Equation (27-68), $$N_{pld} = (N_{SYM,init} - m_{STBC})N_{DBPS} + m_{STBC}N_{DBPS,last,init} \quad (27\text{-}68)$$

$N_{avbits}$ needs to be updated based on a_init, as defined in Equation (103):

$$N_{avbits} = \begin{cases} N_{SYM,init} \cdot N_{CBPS}, & a_{init} = 1 \text{ or } 2 \\ (N_{SYM,init} + 1) \cdot N_{CBPS}, & a_{init} = 3 \text{ or } 4 \end{cases} \quad (103)$$

In a receiver decoding process, as defined in Equation (104), $$N_{pld} = \begin{cases} N_{SYM} \cdot N_{DBPS} + N_{DBPS,last} & a_{init} = 1 \text{ or } 2 \\ (N_{SYM} - 1) \cdot N_{DBPS} + N_{DBPS,last}, & a_{init} = 3 \text{ or } 4 \end{cases} \quad (104)$$

where $N_{sym}$ is the same as IEEE 802.11ax/be, as defined in Equation (27-119):

$$N_{SYM} = \left\lfloor \left( \frac{\text{L\_LENGTH} + m + 3}{3} \times 4 - T_{HE\text{-}PREAMBLE} - N_{MA} N_{HE\text{-}LTF} T_{HE\text{-}LTF\text{-}SYM} \right) / T_{SYM} \right\rfloor - b_{PE\text{-}Disambiguity} \quad (27\text{-}119)$$

In some embodiments, if 1-bit "extra symbol" is signaled in the SIG, at the receiver side, as defined in Equation (105), $$N_{pld} = (N_{SYM} - \text{Extra\_symbol}) \cdot N_{DBPS} + N_{DBPS,last} \quad (105)$$

$N_{DBPS,last}$ corresponds to the a_init.

In one variant, the scheme of encoding to the end of the 4× OFDM symbol only applies to payload length that corresponds to the number of OFDM symbol(s) within certain limit, e.g., 1 symbol. Segment based extra segment incremental may be applied when the number of OFDM symbol(s) is above the limit. For example, the number of OFDM symbol(s) limit is 1. In some embodiments, if the payload corresponds to a_init=1, 2, 3 and $N_{sym\_init}$=1, the encoding boundary is the end of the symbol, i.e., Navbits=$N_{CBPS}$ ($N_{CBPS}$ may be the number of coded bits per OFDM symbol, $N_{sym}$ may be the number of OFDM symbol), and the step d) check will be bypassed, and no additional extra segment is added. In some embodiments, if the payload corresponds to a_init=4 or $N_{sym\_init}$>1, the same encoding procedure as IEEE 802.11ax applies. For signaling, a 2-bit "pre-FEC padding factor" may be used. In some embodiments, 1-bit "extra symbol" can be signaled to simplify Rx processing.

Some examples of transmitter (Tx)/receiver (Rx) coding parameter change are described. In an encoding process (using $N_{sym}$ threshold 1 as an example), if $N_{sym,init}$==1, $N_{avbits}$ is fixed at $N_{CBPS}$, as defined in Equation (106), $$N_{avbits} = \begin{cases} N_{CBPS}, & N_{sym,init} = 1 \\ (N_{SYM,init} - 1) \cdot N_{CBPS} + N_{CBPS,last}, & N_{sym,init} > 1 \end{cases} \quad (106)$$

In a receiver decoding process, as defined in Equation (107), Equation (108), and Equation (27-119), $$N_{pld} = (N_{SYM} - 1) \cdot N_{DBPS} + N_{DBPS,last} \quad (107)$$

$$N_{avbits} = \begin{cases} N_{CBPS}, & N_{sym} = 1 \\ (N_{SYM,init} - 1) \cdot N_{CBPS} + N_{CBPS,last}, & N_{sym} > 1 \end{cases} \quad (108)$$

where $$N_{SYM} = \left\lfloor \left( \frac{\text{L\_LENGTH} + m + 3}{3} \times 4 - T_{HE\text{-}PREAMBLE} - N_{MA} N_{HE\text{-}LTF} T_{HE\text{-}LTF\text{-}SYM} \right) / T_{SYM} \right\rfloor - b_{PE\text{-}Disambiguity} \quad (27\text{-}119)$$

The above described operations may be performed by or using a wireless transceiver (e.g., the wireless transmitter 402 depicted in FIG. 4). For example, the above described operations may be performed by or using the FEC encoder 426 (e.g., a LDPC encoder) of the wireless transmitter 402 depicted in FIG. 4.

In some embodiments, a method of improving receiver Rx sensitivity for short data packet transmission and reducing large Rx sensitivity fluctuation due to the small data packet length variation involves modifying the LDPC encoding process.

In some embodiments, a transmitter (e.g., the wireless transmitter 402 depicted in FIG. 4) identifies whether a transmission is a short data packet and LDPC is used as FEC for encoding the packet. If the condition is met, the transmitter may modify the LDPC encoding process: bypassing step d) of the LDPC encoding process and always adding an extra LDPC symbol segment code bits if the number of parity bits to be punctured is greater than zero. The transmitter may update the total number of code bits with the additional code bits in the extra symbol segment and recomputing the number of punctured parity bits. If no parity bits are to be punctured, the transmitter may compute the number of code bits to be repeated.

In some embodiments, if LDPC is used as FEC for encoding the packet, a transmitter (e.g., the wireless transmitter 402 depicted in FIG. 4) checks whether the data packet length meets the small packet length criteria. If the data packet is identified as a small data packet, the transmitter may use a smaller punctured parity bits ratio than 10% in LDPC encoding process step d) condition check (e.g., 5% or lower). If the step d) condition with the smaller ratio is met, an extra LDPC symbol segment code bits may be added to the total number of code bits. The transmitter may update the total number of code bits with the additional code bits in the extra symbol segment and recompute the number of punctured parity bits. If no parity bits are to be punctured, the transmitter may compute the number of code bits to be repeated.

In some embodiments, if LDPC is used as FEC for encoding the packet, a transmitter (e.g., the wireless transmitter 402 depicted in FIG. 4) checks whether the condition in LDPC encoding process step d) is met. If the condition in step d) is not met, the transmitter may further check whether the data packet length meets the small packet length criteria. If the data packet is identified as a small data packet, an extra LDPC symbol segment code bits may be added to the total number of code bits. The transmitter may update the total number of code bits with the additional code bits in the extra symbol segment and recompute the number of punctured parity bits. If no parity bits are to be punctured, the transmitter may compute the number of code bits to be repeated.

In some embodiments, if LDPC is used as FEC for encoding the packet, a transmitter (e.g., the wireless transmitter 402 depicted in FIG. 4) checks whether the condition in LDPC encoding process step d) is met. If the condition in step d) is not met, the transmitter may further check whether the data packet length meets the small packet length criteria. If the data packet is identified as a small data packet, the transmitter may use a smaller punctured parity bits ratio than 10% in LDPC encoding process step d) condition check (e.g., 5% or lower). If the step d) condition with the smaller ratio is met, an extra LDPC symbol segment code bits may be added to the total number of code bits. The transmitter may update the total number of code bits with the additional code bits in the extra symbol segment and recompute the number of punctured parity bits. If no parity bits are to be punctured, the transmitter may compute the number of code bits to be repeated.

In some embodiments, if LDPC is used as FEC for encoding the packet, a transmitter (e.g., the wireless transmitter 402 depicted in FIG. 4) checks whether the condition in LDPC encoding process step d) is met. If the condition in step d) is not met, the transmitter may further check whether the data packet length meets the small packet length criteria and pre-FEC padding factor dinit<4. If the second condition check is met, an extra LDPC symbol segment code bits may be added to the total number of code bits. The transmitter may update the total number of code bits with the additional code bits in the extra symbol segment and recompute the number of punctured parity bits. If no parity bits are to be punctured, the transmitter may compute the number of code bits to be repeated.

In some embodiments, if LDPC is used as FEC for encoding the packet, a transmitter (e.g., the wireless transmitter 402 depicted in FIG. 4) checks whether the condition in LDPC encoding process step d) is met. If the condition in step d) is not met, the transmitter may further check whether the data packet length meets the small packet length criteria and pre-FEC padding factor $\alpha_{init}<4$. If the second condition check is met, the transmitter may use a smaller punctured parity bits ratio than 10% in LDPC encoding process step d) condition check (e.g., 5% or lower). If the step d) condition with the smaller ratio is met, an extra LDPC symbol segment code bits may be added to the total number of code bits. The transmitter may update the total number of code bits with the additional code bits in the extra symbol segment and recompute the number of punctured parity bits. If no parity bits are to be punctured, the transmitter may compute the number of code bits to be repeated.

In some embodiments, if LDPC is used as FEC for encoding the packet, a transmitter (e.g., the wireless transmitter 402 depicted in FIG. 4) uses a finer granularity than $N_{DBPS,short}$ in the pre-FEC padding, and defines the number of data input bits to LDPC encoder as $N_{pld}=(N_{SYM}-1)\cdot N_{DBPS}+(\alpha_{init}-1)\cdot N_{DBPS,short}+b \cdot N_{DBPS}$, short/K, where K>1 is a divisor of $N_{DBPS,short}$, and $0<b\leq K$.

Figure 9:
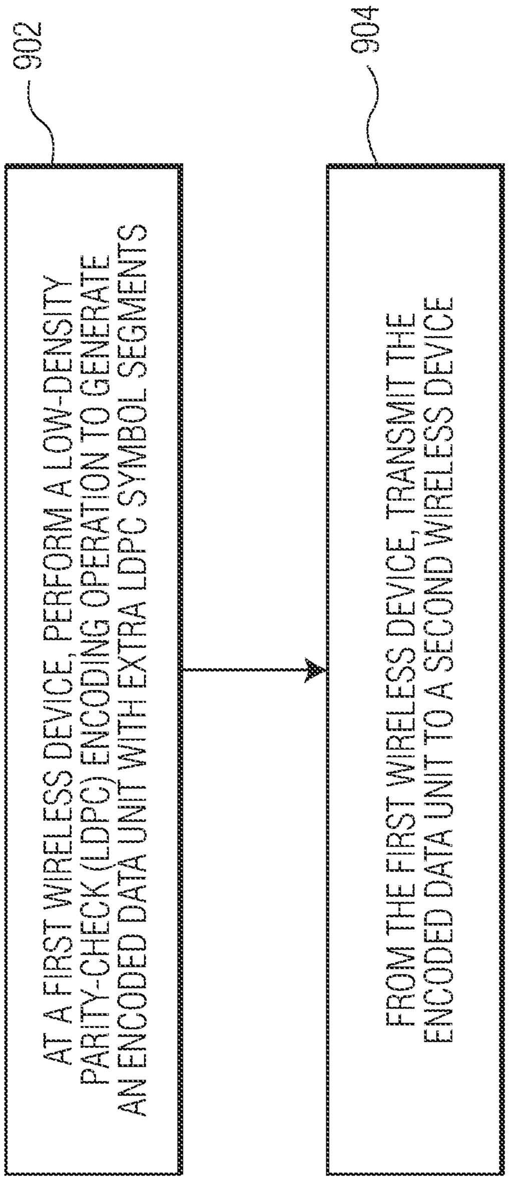
FIG. 9 is a process flow diagram of a method for wireless communications in accordance with an embodiment of the invention.

FIG. 9 is a process flow diagram of a method for wireless communications in accordance with an embodiment of the invention. At block 902, at a first wireless device, a low-density parity-check (LDPC) encoding operation is performed to generate an encoded data unit with extra LDPC symbol segments. At block 904, from the first wireless device, the encoded data unit is transmitted to a second wireless device. In some embodiments, the encoded data includes a physical layer protocol data unit (PPDU). In some embodiments, the encoded data includes a payload that contains orthogonal frequency division multiplexing (OFDM) symbols, and a number of the OFDM symbols contained in the payload is equal to or smaller than a predefined threshold. In some embodiments, the predefined threshold is two. In some embodiments, a number of extra LDPC symbol segments to be included in the encoded data unit is determined based on different criteria. In some embodiments, one extra LDPC symbol segment is included in the encoded data unit based on a first criterion, two extra LDPC symbol segments are included in the encoded data unit based on a second criterion, and three extra LDPC symbol segments are included in the encoded data unit based on a third criterion. In some embodiments, two extra LDPC symbol segments are included in the encoded data unit based on a first criterion and three extra LDPC symbol segments are included in the encoded data unit based on a second criterion. In some embodiments, an extra symbol segment field is defined to indicate the extra LDPC symbol segments within the encoded data unit. In some embodiments, a 2-bit extra symbol segment field is defined to indicate up to three extra LDPC symbol segments included in the encoded data unit. In some embodiments, an adaptive number of extra LDPC symbol segments to be included the encoded data unit are determined to fill to an end of an OFDM symbol. In some embodiments, the adaptive number of extra LDPC symbol segments is greater than a threshold, and an extra orthogonal frequency division multiplexing (OFDM) symbol is added if an initial number of the extra LDPC symbol segments is less than the threshold. In some embodiments, in response to the control signal, an additional extra LDPC symbol segment is added in the encoded data unit when the number of OFDM symbols contained in a payload of the encoded data unit is equal to or smaller than a predefined threshold. In some embodiments, an additional extra LDPC symbol segment is added in the encoded data unit based on a punctured parity bit ratio that is lower than a standard punctured parity bit ratio when a number of the OFDM symbols contained in a payload of the encoded data unit is equal to or smaller than a predefined threshold. In some embodiments, a smallest encoding boundary of a last OFDM data symbol and a size of an LDPC symbol segment is less than a standard value of ¼ of one OFDM symbol. In some embodiments, the first wireless device includes a wireless access point (AP), and the second wireless device includes a non-AP wireless station (STA) device. In some embodiments, the first wireless device is compatible with an Institute of Electrical and Electronics Engineers (IEEE) 802.11 protocol. In some embodiments, the first wireless device is a component of a multi-link device (MLD). The first wireless device and/or the second wireless device may be the same as or similar to an embodiment of the AP 106 depicted in FIG. 1, the STA 110-1, . . . , 110-*n* depicted in FIG. 1, the APs 206-1, 206-2 depicted in FIG. 2, the STAs 210-1, 210-2 depicted in FIG. 2, the wireless device 300 depicted in FIG. 3, and/or the wireless device 400 depicted in FIG. 4.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random-access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A wireless device comprising:

a controller configured to generate a control signal; and a wireless transceiver configured to, in response to the control signal, perform a low-density parity-check (LDPC) encoding operation to generate an encoded data unit with a plurality of extra LDPC symbol segments, wherein the encoded data unit comprises a payload that contains includes a number orthogonal frequency division multiplexing (OFDM) symbols, and wherein the number of the OFDM symbols contained in the payload is equal to or smaller than a predefined threshold.

2. The wireless device of claim 1, wherein the encoded data unit comprises the data field of a physical layer protocol data unit (PPDU).

3. The wireless device of claim 1, wherein the encoded data unit relates to one MAC Protocol Data Unit (MPDU).

4. The wireless device of claim 1, wherein the wireless transceiver is further configured to, in response to the control signal, determine a number of extra LDPC symbol segments of the plurality of extra LDPC symbol segments to be included in the encoded data unit based on a plurality of different criteria.

5. The wireless device of claim 4, wherein the wireless transceiver is further configured to, in response to the control signal, determine two extra LDPC symbol segments to be included in the encoded data unit based on a first criterion and to determine three extra LDPC symbol segments to be included in the encoded data unit based on a second criterion.

6. The wireless device of claim 1, wherein the wireless transceiver is further configured to, in response to the control signal, set an extra symbol segment field to indicate the extra LDPC symbol segments within the encoded data unit.

7. The wireless device of claim 1, wherein the wireless transceiver is further configured to, in response to the control signal, set a 2-bit extra symbol segment field to indicate the inclusion of the plurality of extra LDPC symbol segments in the encoded data unit.

8. The wireless device of claim 1, wherein the wireless transceiver is further configured to, in response to the control signal, determine an adaptive number of extra LDPC symbol segments to be included in the encoded data unit to fill to an end of an OFDM symbol.

9. The wireless device of claim 8, wherein the adaptive number of extra LDPC symbol segments is greater than a threshold, and wherein an OFDM symbol is added if an initial number of the extra LDPC symbol segments is less than the threshold.

10. The wireless device of claim 1, wherein the predefined threshold is one OFDM symbol.

11. The wireless device of claim 1, wherein the wireless transceiver is further configured to, in response to the control signal, add an additional extra LDPC symbol segment in the encoded data unit based on a punctured parity bit ratio that is lower than a standard punctured parity bit ratio when a number of OFDM symbols contained in a payload of the encoded data unit is equal to or smaller than a predefined threshold.

12. The wireless device of claim 1, wherein a smallest encoding boundary of a last OFDM data symbol and a size of an LDPC symbol segment is less than a standard value of ¼ of one OFDM symbol.

13. The wireless device of claim 1, wherein the wireless device comprises a wireless access point (AP), and wherein the wireless transceiver is further configured to transmit the encoded data unit to a second device, which comprises a non-AP wireless station (STA) device.

14. The wireless device of claim 1, wherein the wireless device is compatible with an Institute of Electrical and Electronics Engineers (IEEE) 802.11 protocol.

15. The wireless device of claim 1, wherein the wireless device is a component of a multi-link device (MLD).

16. A wireless access point (AP) comprising:

a controller configured to generate a control signal; and a wireless transceiver configured to, in response to the control signal, perform a low-density parity-check (LDPC) encoding operation for a MAC Protocol Data Unit (MPDU) to generate a physical layer protocol data unit (PPDU) with a plurality of extra LDPC symbol segments corresponding to the MPDU and to transmit the PPDU to a non-AP wireless station (STA) device, wherein the PPDU comprises a payload that contains a number of orthogonal frequency division multiplexing (OFDM) symbols, and wherein the number of the OFDM symbols contained in the payload is equal to or smaller than a predefined threshold.

17. The wireless AP of claim 16, wherein the wireless transceiver is further configured to, in response to the control signal, determine a number of extra LDPC symbol segments of the plurality of extra LDPC symbol segments to be included in the PPDU based on a plurality of different criteria.

18. The wireless AP of claim 16, wherein the wireless transceiver is further configured to, in response to the control signal, define a 2-bit extra symbol segment field to indicate the inclusion of the plurality of extra LDPC symbol segments in the PPDU.

19. The wireless AP of claim 16, wherein the predefined threshold is one OFDM symbol.

20. A method for wireless communications, the method comprising:

performing, by a first wireless device, a low-density parity-check (LDPC) encoding operation to generate an encoded data unit with a plurality of extra LDPC symbol segments, wherein the encoded data unit comprises a payload that contains includes a number orthogonal frequency division multiplexing (OFDM) symbols, and wherein the number of the OFDM symbols contained in the payload is equal to or smaller than a predefined threshold; and transmitting, by the first wireless device, the encoded data unit to a second wireless device.

* * * * *